(12) United States Patent
Fu et al.

(10) Patent No.: US 11,606,486 B2
(45) Date of Patent: Mar. 14, 2023

(54) ACTUATOR, CAMERA MODULE AND CAMERA MOUNTING DEVICE

(71) Applicant: New Shicoh Motor Co., LTD, Zhejiang (CN)

(72) Inventors: Xuepeng Fu, Zhejiang (CN); Tatsuki Wade, Zhejiang (CN)

(73) Assignee: NEW SHICOH MOTOR CO., LTD, Zhejiang (CN)

( * ) Notice: Subject to any disclaimer, the term of this patent is extended or adjusted under 35 U.S.C. 154(b) by 43 days.

(21) Appl. No.: 17/015,626

(22) Filed: Sep. 9, 2020

(65) Prior Publication Data
US 2021/0084202 A1 Mar. 18, 2021

(30) Foreign Application Priority Data
Sep. 18, 2019 (CN) .......................... 201910883971.8

(51) Int. Cl.
*H04N 5/232* (2006.01)
*H04N 5/225* (2006.01)
*H05K 1/02* (2006.01)
*H04M 1/02* (2006.01)

(52) U.S. Cl.
CPC ....... *H04N 5/2253* (2013.01); *H04N 5/23287* (2013.01); *H05K 1/028* (2013.01); *H04M 1/0264* (2013.01); *H05K 2201/10151* (2013.01)

(58) Field of Classification Search
CPC .. H04N 5/2253; H04N 5/2254; H04N 5/2257; H04N 5/23287

USPC ............................................ 348/208.99, 374
See application file for complete search history.

(56) References Cited

U.S. PATENT DOCUMENTS

| | | | | |
|---|---|---|---|---|
| 10,288,835 | B2* | 5/2019 | Park | G03B 13/36 |
| 2015/0201128 | A1* | 7/2015 | Dong | H04N 5/2253 |
| | | | | 348/208.11 |
| 2018/0217348 | A1* | 8/2018 | Han | H04N 5/22521 |
| 2018/0364446 | A1* | 12/2018 | Osaka | H01L 43/06 |
| 2019/0058832 | A1* | 2/2019 | Huang | H04N 5/23212 |
| 2020/0166771 | A1* | 5/2020 | Huang | H04N 5/2254 |
| 2020/0314338 | A1* | 10/2020 | Johnson | H04N 5/23287 |

FOREIGN PATENT DOCUMENTS

JP 2013-50668 A 3/2013

\* cited by examiner

*Primary Examiner* — Anthony J Daniels
(74) *Attorney, Agent, or Firm* — Hayes Soloway PC

(57) ABSTRACT

An actuator is disclosed having a sensor substrate, a coil substrate and an FPC. The sensor substrate includes an image sensor on a front surface thereof. The coil substrate includes a coil for driving the image sensor and is provided with a first through hole. The FPC includes a main body portion and a coupling portion extending from a periphery of the main body portion and is coupled to an outside element. The main body portion is provided with a second through hole. The sensor substrate is fixed to the main body portion from a rear side, the coil substrate is fixed to the main body portion from a front side, and the image sensor is exposed to a front surface through the first through hole and the second through hole.

6 Claims, 14 Drawing Sheets

US 11,606,486 B2

ACTUATOR, CAMERA MODULE AND CAMERA MOUNTING DEVICE

CROSS-REFERENCE TO RELATED APPLICATION

This application claims priority to Chinese patent application CN201910883971.8, filed on Sep. 18, 2019, the contents of which are incorporated herein by reference.

TECHNICAL FIELD

The present disclosure relates to an actuator, a camera module and a camera mounting device used in electronic apparatus such as smartphones.

BACKGROUND

Among camera modules with a shake correction function mounted on electronic apparatus such as smartphones, there is a type called sensor shift, which corrects a shake by moving an image sensor in a plane orthogonal to the optical axis direction of a lens. As an example of a document disclosing a technique related to such a camera module, Japanese laid-open patent publication No. 2013-050668 (hereinafter referred to as "Patent Document 1") can be given. The camera shake prevention autofocus module of Patent Document 1 accommodates an assembly of an autofocus structure and an assembly of a camera shake prevention structure in a box-shaped case with an opening through which a lens is exposed in a direction toward a subject. The assembly of the autofocus structure drives the lens in the z-axis direction, and the assembly of the camera shake prevention structure drives the image sensor in the x-axis and y-axis direction. A vibration absorbing material such as soft gel or a soft spring is added between a component of a movable portion, such as a lens or an image sensor, and a component of a fixed portion other than the movable portion.

The camera shake prevention autofocus module of Patent Document 1 is configured in such a manner that a mounting substrate for an image sensor is disposed at the rearmost portion of the case opposite to the exposure opening for the lens, and an electric wire for supplying electricity is wound from this mounting substrate to the camera shake prevention structure and further to the previous autofocus structure. Therefore, there is a problem that it is difficult to make efficient electrical connection.

SUMMARY

The present disclosure has been made in view of such a problem, and one of objects of the present disclosure is to provide an actuator, a camera module, and a camera mounting device, which can efficiently perform power supply wiring of a device having a mechanism for correcting a camera shake by moving an image sensor.

In accordance with a first aspect of the present disclosure, there is provided an actuator including: a sensor substrate having an image sensor on a front surface thereof; a coil substrate that has a coil for driving the image sensor and is provided with a first through hole; and an FPC having a main body portion and a coupling portion extending from a periphery of the main body portion and coupled to outside. The main body portion is provided with a second through hole, the sensor substrate is fixed to the main body portion from a rear side, the coil substrate is fixed to the main body portion from a front side, and the image sensor is exposed to a front surface through the first through hole and the second through hole.

In accordance with a second aspect of the present disclosure, there is provided a camera module including the above actuator.

In accordance with a third aspect of the present disclosure, there is provided a camera mounting device including the above camera module.

DETAILED DESCRIPTION

Figure 1:
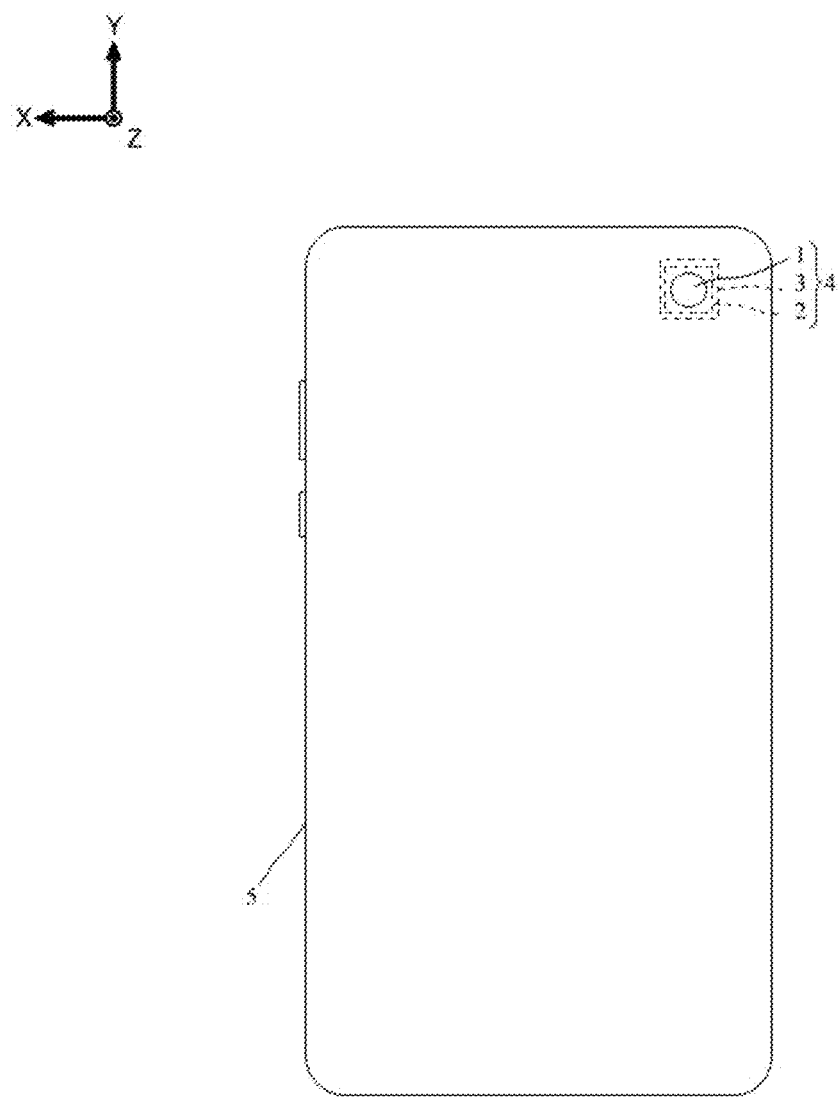
FIG. 1 is a front view of a smartphone as a camera mounting device on which a camera module, which includes an actuator in accordance with one embodiment of the present disclosure, is mounted.

Hereinafter, embodiments of the present disclosure will be described with reference to the drawings. As shown in FIG. 1, in the present embodiment, a camera module 4 is mounted on a smartphone 5. The camera module 4 includes: a lens body 1 as an optical element; an image sensor 2 that photoelectrically converts light introduced from a subject through the lens body 1; and an actuator 3. The actuator 3 has both: a lens driving device that performs autofocus control based on driving of the lens body 1; and an image sensor driving device that performs camera shake correction control based on driving of the image sensor 2.

Hereinafter, an optical axis direction along the optical axis of the lens body 1 is appropriately referred to as a Z direction, one direction orthogonal to the Z direction is appropriately referred to as an X direction and a direction orthogonal to both the Z direction and the X direction is appropriately referred to as a Y direction. In addition, the +Z side of the optical axis of the lens body 1 on the subject side is sometimes referred to as a front side, and the −Z side on which the image sensor 2 is provided opposite to the subject is sometimes referred to as a rear side. In addition, the +Y side is sometimes referred to as an upper side, the −Y side is sometimes referred to as a lower side, the +X side is sometimes referred to as a left side, and the −X side is sometimes referred to as a right side.

Figure 2:
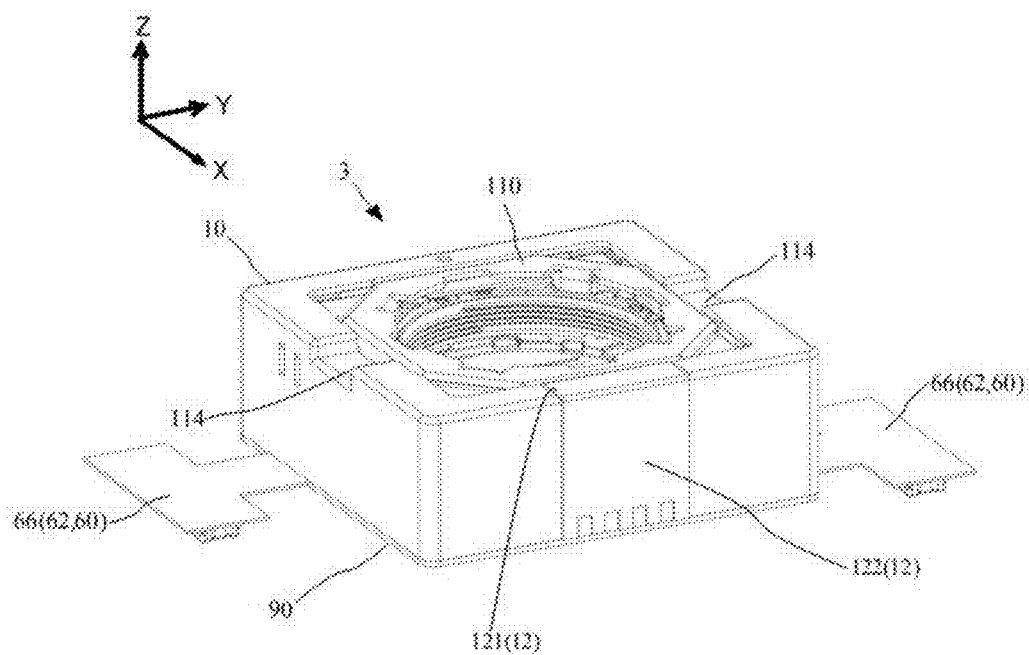
FIG. 2 is a perspective view of the actuator of FIG. 1.
Figure 3:
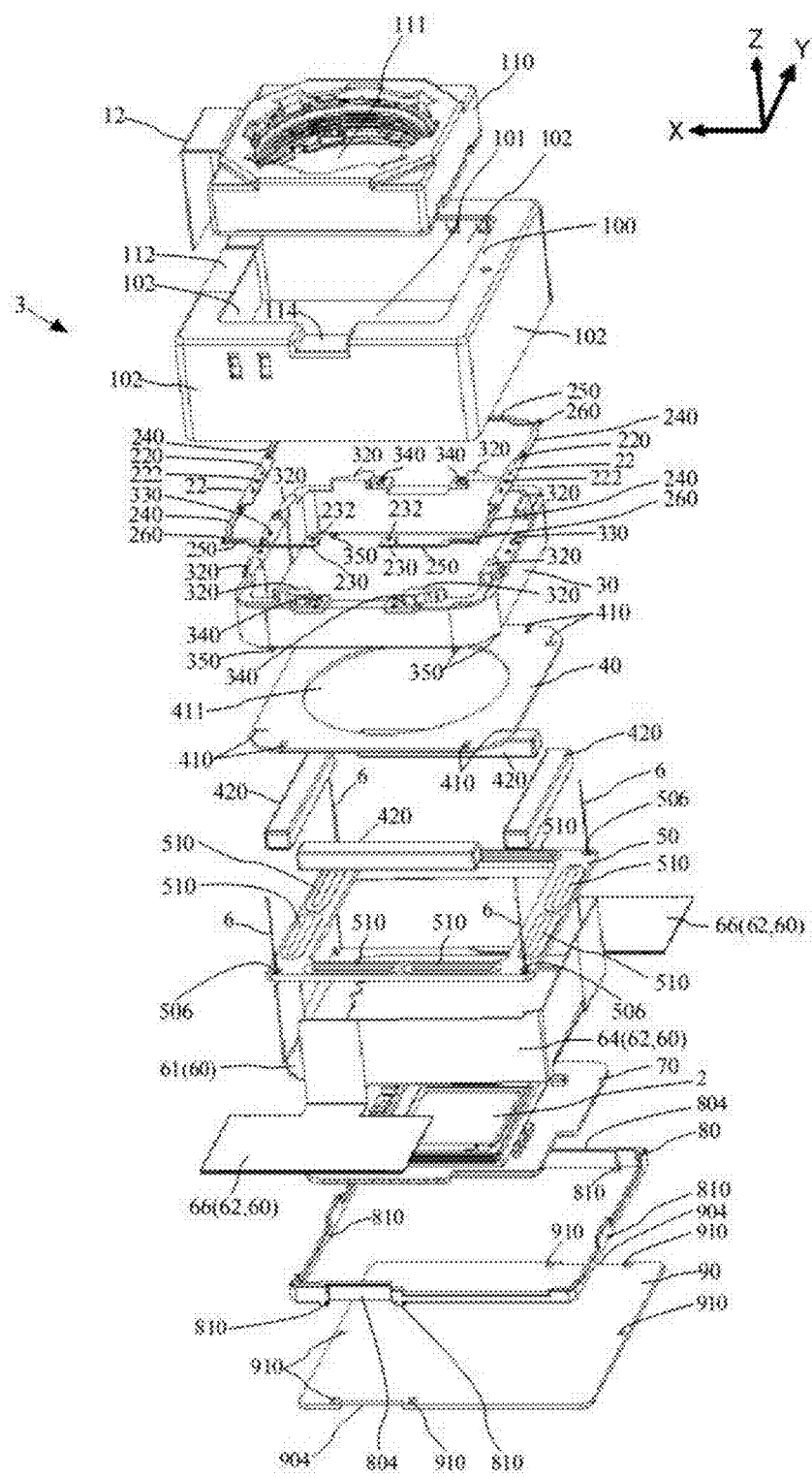
FIG. 3 is a perspective view of the exploded actuator of FIG. 2.
Figure 4:
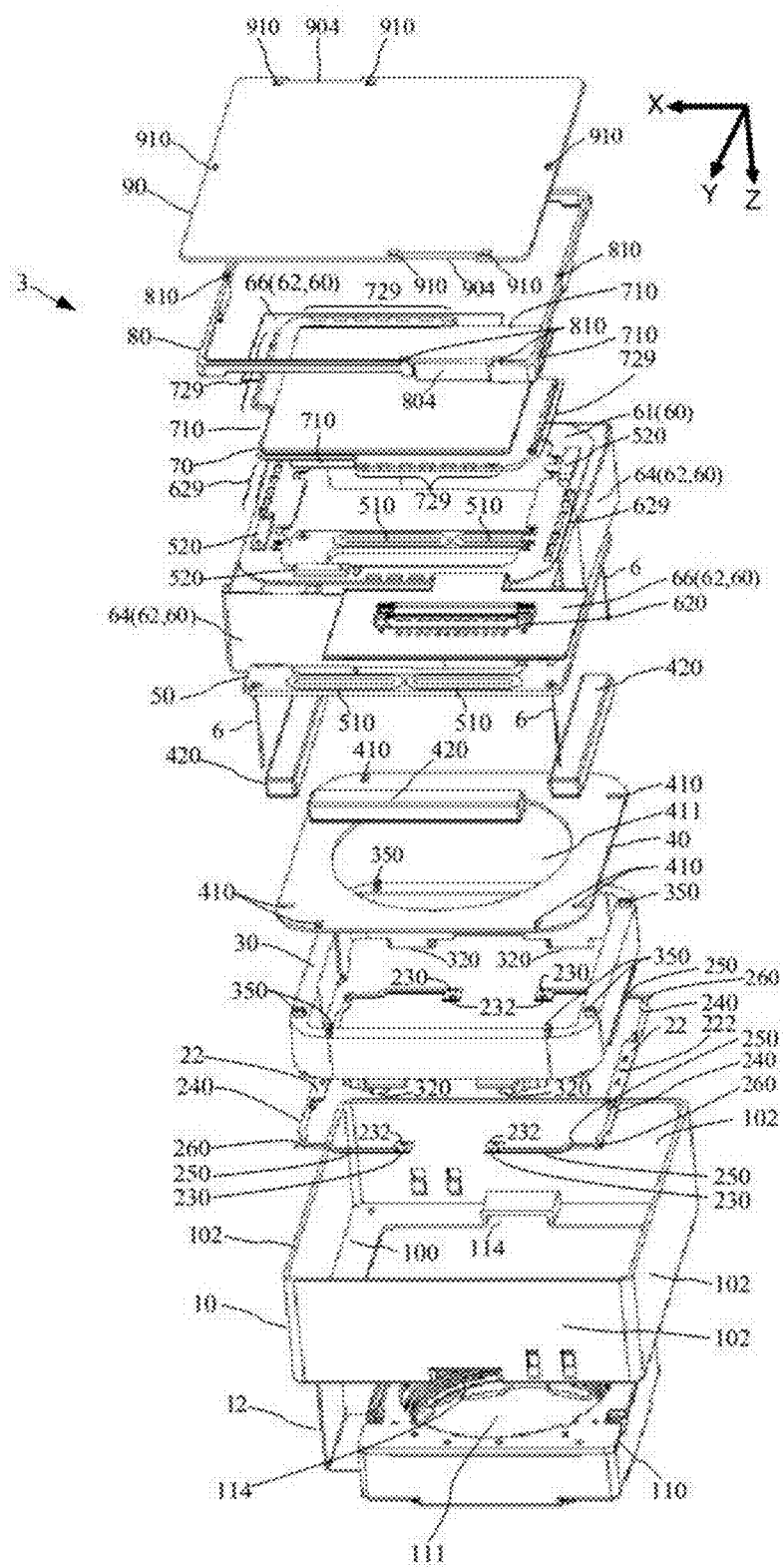
FIG. 4 is an exploded perspective view of the actuator of FIG. 2 as viewed from another point of view.

As shown in FIGS. 2-4, the actuator 3 includes a housing, a lens driving device and an image sensor driving device which are accommodated in the housing. The housing includes a case 10, a frame body 80, and a bottom plate 90. The lens driving device includes an AF motor 110 and a first FPC12. AF is an abbreviation of Auto Focus (autofocus). FPC is an abbreviation of Flexible Printed Circuits. The AF motor 110, which corresponds to a lens driving mechanism, drives the lens body 1 forward and backward in the optical axis direction, i.e., the Z direction. The driving source of the AF motor 110 may include, but is not limited to, magnets, coils, piezoelectric elements, shape memory alloys, and the like. In addition, as the supporting mechanism of the lens body 1, a plate spring, a bearing, a guide slot, a supporting shaft and the like may be listed, but the supporting mechanism is not limited to these elements.

The image sensor driving device includes a supporting plate spring 22, a holder 30, a partition plate 40, a magnet 420, a coil substrate 50, a second FPC60, a sensor substrate 70 and a suspension wire 6. The image sensor driving mechanism has a magnet 420 and a coil 510 provided on a coil substrate 50 as a driving source thereof, and has a supporting plate spring 22 and a suspension wire 6 as a supporting mechanism. The image sensor driving device drives a movable portion on which the image sensor 2 is mounted in the X direction and the Y direction with respect to the fixed portion. Here, the fixed portion includes a supporting plate spring 22, a holder 30, a partition plate 40, and a magnet 420, and the movable portion includes a coil substrate 50, a second FPC60, and a sensor substrate 70.

The configuration of each portion will be described in more detail. The case 10 has a hollow rectangular parallelepiped box shape surrounded by a front wall 100 and a side wall 102 extending rearward from the periphery of the front wall 100. A rectangular through hole 101 is formed in the center of the front wall 100. In the front wall 100, portions between the side wall 102, and the through hole 101 are recessed rearward as recessed portions 114 on the upper side and lower side, respectively. In addition, the front wall 10 is provided with a rectangular slot 112 between the side wall 102 on the left side and the through hole 101.

The AF motor 110 is formed in a rectangular parallelepiped shape and has widths in the X direction and the Y direction slightly smaller than the sizes of the through hole 101 of the case 10 and the through hole 311 of the holder 30. The AF motor 110 is bored with a perfect circular through hole 111 that penetrates between the front surface and the rear surface. The lens body 1 is fitted into the through hole 111. The side surface of the AF motor 110 is adhesively fixed to the inner side surface of the holder 30.

Figure 5:
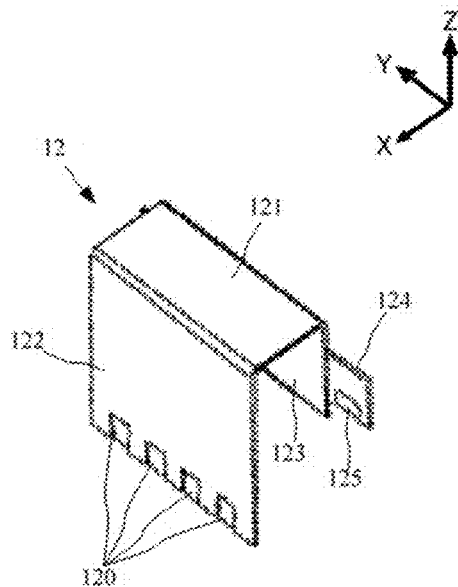
FIG. 5 is a perspective view of a first FPC12 of FIG. 3.

The first FPC12 supplies electric current supplied from the outside of the actuator 3 to the AF motor 110. As shown in FIG. 5, the first FPC12 has a shape in which a rectangular plate is bent into a hook shape with a long plate portion 122, a short plate portion 123, and a top portion 121 coupling the two plate portions at front ends. The long plate portion 122 and the short plate portion 123 opposed to each other with the top portion 121 therebetween face each other in parallel. The short plate portion 123 further has a connecting plate portion 124 that is folded back on the side opposite to the long plate portion 122. A plurality of terminals 120 and 125 arranged in parallel in the Y direction are provided at the rear portions of the long plate portion 122 and the connecting plate portion 124.

Figure 6:
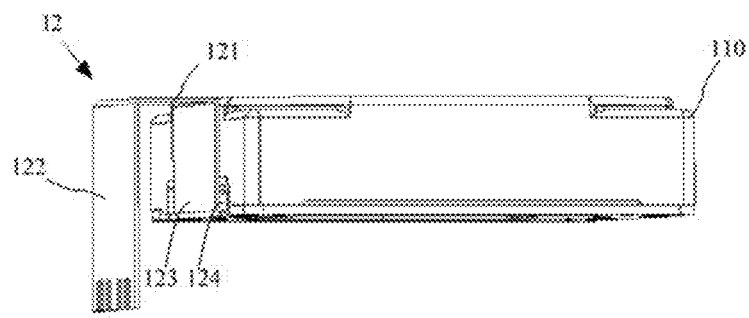
FIG. 6 is a perspective view of the first FPC12 and an AF motor of FIG. 3.

As shown in FIG. 2, in the first FPC12, the long plate portion 122 extends to the front side along the outer side surface of the side wall 102 of the case 10, the top portion 121 is fitted into the slot 112 of the front wall 100, and the short plate portion 123 enter the inside of the case 10 from the through hole 111. As shown in FIG. 6, inside the case 10, the short plate portion 123 faces the side surface of the AF motor 110 and the terminal 125 of the connecting plate portion 124 is electrically connected to the AF motor 110.

In FIG. 3 and FIG. 4, the supporting plate spring 22 is formed in a U-shape having two corner portions, and two supporting plate springs 22 are arranged in such a manner that both ends are abutted to each other. The supporting plate spring 22 has small rectangular sheet portions 230 having a relatively small rectangular shape at both ends of the U-shape, and a rectangular large rectangular sheet portion 220 along the straight line in the middle of the central straight line of the U-shape. A first spring portion 240 extending in a substantially straight line is configured between the large rectangular sheet portion 220 and each corner portion of the U-shape, a second spring portion 250 extending in a substantially straight line is configured between each small rectangular sheet portion 230 and each corner portion of the U-shape, and a supporting portion 260 for supporting the suspension wire 6 is formed at a portion where the first spring portion 240 and the second spring portion 250 intersect each other. A positioning hole 222 is bored in the center of each large rectangular sheet portion 220, and a positioning hole 232 is bored in the center of each small rectangular sheet portion 230. The supporting portion 260, each of which is a portion bent at a right angle of the supporting plate spring, is provided with a V-shaped notch 226. The front end of the suspension wire 6 is inserted through and soldered to the notch 226.

The holder 30 is formed in a quadrangular frame shape surrounding the upper, lower, left, and right sides by the peripheral wall. The four corners of the holder 30 are chamfered into an arc shape. Two protruding portions 320 are provided on the front surface of each side of the quadrangular shape of the holder 30.

On the left side and the right side of the quadrangular shape of the holder 30, one positioning protrusion 330 is provided on the front surface between two protruding portions 320. In addition, on the upper side and the lower side of the quadrangular shape, two positioning protrusions 340 are respectively provided on the front surface between the two protruding portions 320. Two positioning protrusions 350 are respectively provided on the rear surface of each side of the quadrangular shape of the holder 30. The front surface between the two positioning protrusions 340 on each side of the holder 30 is recessed more toward the rear side than the other front surfaces, and the recessed portion 115 of the case 10 is accommodated in this portion.

The partition plate 40 has a shape in which four corners of a rectangular plate are rounded into an arc shape. The outline of the partition plate 40 as viewed from the Z direction is the same as that of the holder 30. A through hole 411 in a perfect circular shape is bored in the center of the partition plate 40. Positioning holes 410 are provided at each position of the boundaries between the chamfered portions and the straight portions at the four corners of the partition plate 40. The magnet 420 has a rectangular parallelepiped shape extending in one direction.

The coil substrate 50 is a quadrangular annular plate. A coil 510 is provided inside each end side of the quadrangular shape of the coil substrate 50. Each coil 510 is constituted of two straight portions extending along each side and semicircular portions connecting the two straight portions. On each side, two coils 510 are juxtaposed along the side. Round holes 506 are bored in the four corners of the coil substrate 50, respectively. The suspension wire 6 is inserted through and soldered to the round hole 506.

The second FPC60 supplies an electric current supplied from the outside of the actuator 3 to the image sensor 2 of the sensor substrate 70 and each coil 510 of the coil substrate 50. The second FPC60 is a thin plate symmetrical at one point, and has a main body portion 61 and a pair of coupling portions 62 extending from the periphery of the main body portion 61. Each coupling portion 62 has a straight portion 64 extending linearly, a connecting portion 65 connecting the main body portion 61 and the side portion on one end side of the straight portion 64, and a tip portion 66 extending from the side portion on the other end side of the straight portion 64 to the same side as the connecting portion 65. The tip portion 66 has a substantially T-shape.

Figure 8:
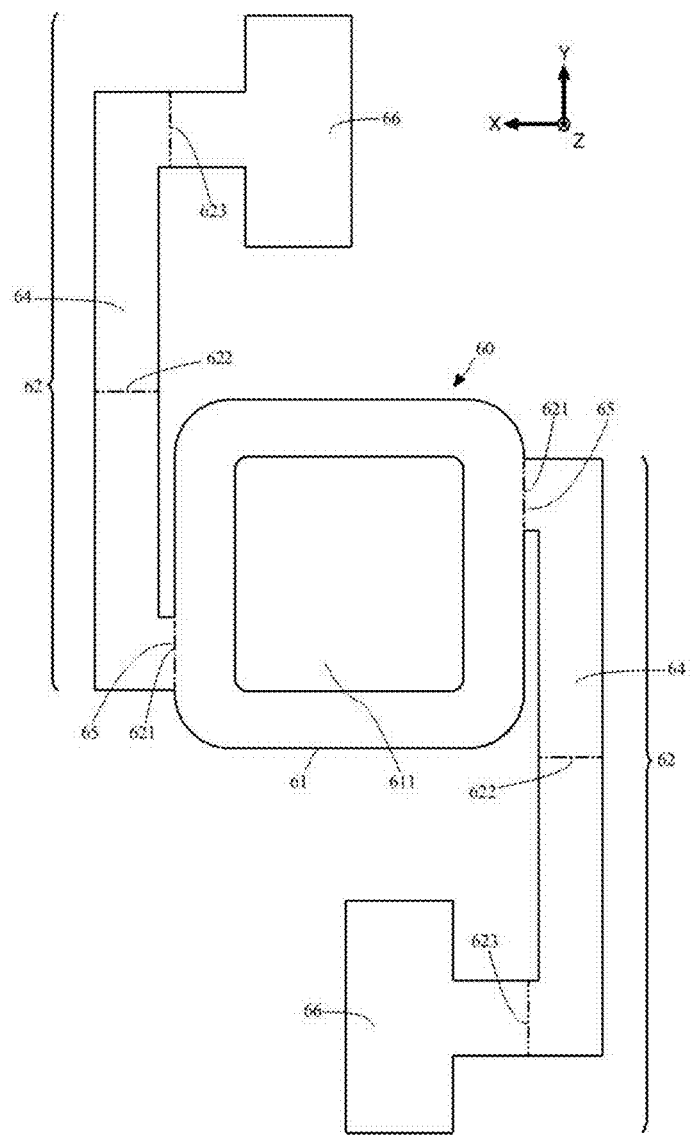
FIG. 8 is a view of developing the second FPC60 of FIG. 7 A.

As shown in FIG. 8, in the second FPC60, a first ridgeline 621 at the boundary between the main body portion 61 and the coupling portion 62, a second ridgeline 622 in the coupling portion 62 and a third ridgeline 623 in the coupling portion 62 are bent to form a three-dimensional shape. The first ridgeline 621 is formed at the connecting portion 65. The second ridgeline 622 is formed in the center part in the extending direction of the straight portion 64. The third ridgeline 623 is formed at the tip portion 66. The first ridgeline 621 and the second ridgeline 622 of the alternate long and short dash lines in FIG. 8 indicate valley fold lines (lines to be bent toward the front of the paper surface), and the third ridgeline 623 of the alternate long and two short dashes line indicates a mountain fold line (a line to be bent toward the back of the paper surface).

Figure 7A:
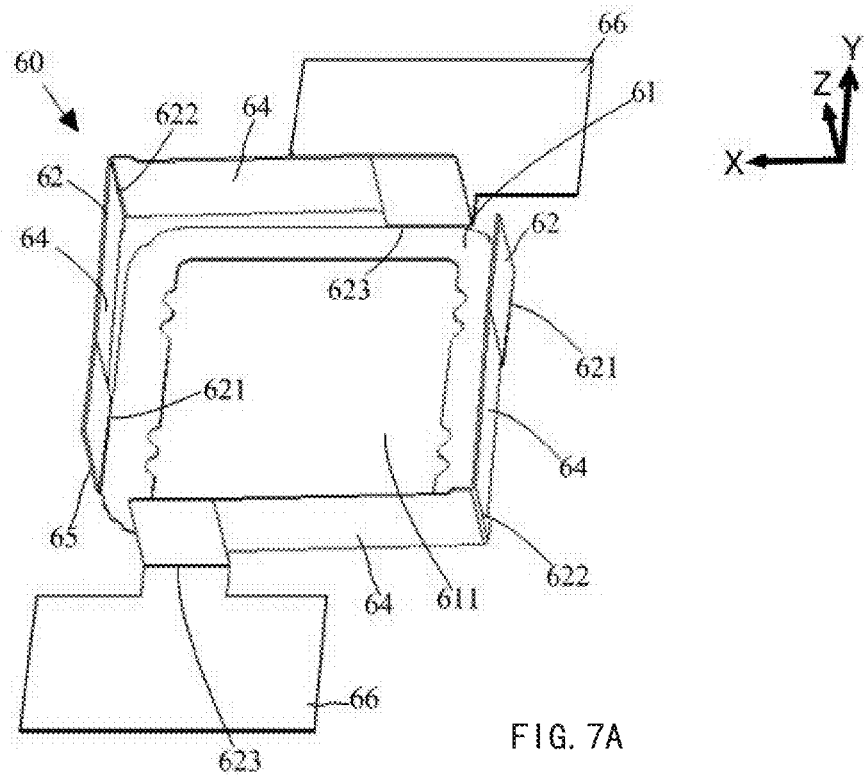
FIG. 7A is a perspective view of a second FPC60 of FIG. 3 as viewed from the +Z side.
Figure 7B:
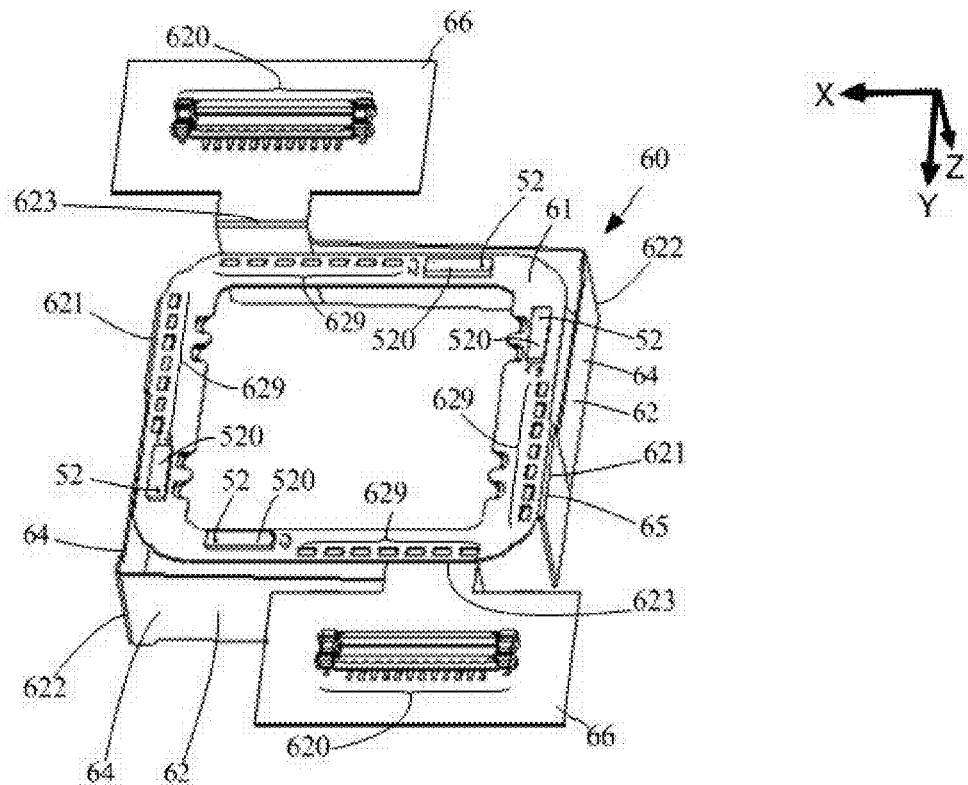
FIG. 7B is a perspective view of a second FPC60 of FIG. 3 as viewed from the −Z side.

As shown in FIG. 7 A, the shape of the second FPC60 after bending is a point-symmetrical box shape with the main body portion 61 constituting the bottom surface thereof and the straight portion 64 constituting the side surface thereof, and two second ridgelines 622 are located at the corner portions forming diagonal corners of a quadrangular shape. The first ridgeline 621 is located at the end portion of one side of the second ridgeline 622 where the corner is expected, and the third ridgeline 623 is located at the end portion of the other side. The tip portion 66 protrudes outward from the third ridgeline 623 at a substantially right angle.

As shown in FIG. 7 B, a plurality of terminals 620 arranged respectively in parallel in the X direction are provided on the rear surface of the tip portion 66. In addition, a plurality of terminals 629 and a driver IC 520 are provided inside the end side on the rear surface of the main body portion 61.

The driver IC 520 is an IC that has a position sensor 52 built therein and manages electric current control for controlling the amount and direction of the electric current supplied to the coil 510. Therefore, the driver IC 520 is arranged at a position corresponding to the coil 510. The position sensor 52 is a Hall element in the present embodiment, but may be an MR element or the like. When the edge portion of the main body portion 61 of the second FPC60 is divided into eight regions of an upper left side, an upper right side, a right upper side, a right lower side, a lower right side, a lower left side, a left lower side, and a left upper side, the connecting portion 65 of the second FPC60 is on the right upper side and the left lower side, the driver IC 520 (position sensor 52) is on the upper left side, the left upper side, the lower right side and the left lower side. That is, since the wiring of the main body portion 61 of the second FPC60 is concentrated in the region where the driver IC 520 (position sensor 52) is present, the connecting portion 65 is preferably provided in the region where the driver IC 520 (position sensor 52) is present.

In FIG. 3 and FIG. 4, the sensor substrate 70 is in a rectangular plate shape, but is fixed to the main body portion 61 of the second FPC60 from the same rear side as the driver IC 520. Therefore, the sensor substrate 70 has a notch 710 corresponding to the position of the driver IC 520 in such a manner that a substantially L-shaped portion including two corners on a diagonal line of the rectangular plate is notched inward. The shape of the notch varies depending on the position of the driver IC 520. The driver ICs 520 having the position sensor 52 built therein, which are arranged on the rear surface of the main body portion 61, are exposed to the rear side through the notches 710 of the sensor substrate 70, respectively. The image sensor 2 is fixed to the center of the front surface of the sensor substrate 70. As shown in FIG. 4, a plurality of terminals 729 corresponding to the terminals 629 are provided inside the edge side of the rear surface of the sensor substrate 70. The terminals 729 of the sensor substrate 70 are electrically connected to the terminals 629 of the main body portion 61 of the second FPC60.

The frame body 80 is formed in a quadrangular annular shape. The quadrangular frame body 80 is provided with slots 804 recessed inward on the right side of the upper side edge and the left side of the lower side edge. In addition, on the rear surface of the frame body 80, positioning protrusions 810 are provided, one by one on each of the left and right side edges and one by one on each side of each slot 804.

The bottom plate 90 is formed in a rectangular plate shape. The quadrangular bottom plate 90 is provided with notches 904 on the left side of the upper side edge and on the right side of the lower side edge. Positioning holes 910 are provided, one by one on each of the left side edge and right side edge of the bottom plate 90 and one by one on each side of each notch 904.

Among the above elements, the supporting plate springs 22, the holder 30, the partition plate 40 and the magnets 420 are integrated as a fixed portion of the image sensor driving device, the coil substrate 50, the second FPC60 and the sensor substrate 70 are integrated as a movable portion of the image sensor driving device. Thus, the supporting plate springs 22 of the fixed portion and the coil substrate 50 of the movable portion are coupled by four suspension wires 6. In addition, the case 10, the frame body 80 and the bottom plate 90 are integrated as the housing of the actuator 3.

More specifically, the supporting plate springs 22 are fixed to the front surface of the holder 30 by fitting the positioning protrusions 330 and 340 of the holder 30 into the positioning holes 222 and 232 of the supporting plate spring 22. The partition plate 40 is fixed to the rear portion of the holder 30 by fitting the positioning protrusions 350 of the holder 30 into the positioning holes 410 of the partition plate 40. The magnets 420 are fixed at positions inside each edge side on the rear surface of the partition plate 40. Thus, the magnets 420 are supported by the holder 30 via the partition plate 40.

The bottom plate 90 is fixed to the frame body 80 from the rear side by fitting the positioning protrusions 810 of the frame body 80 into the positioning holes 910 of the bottom plate 90. The rear side edge of the side wall 102 of the case 10 is fixed to the outer side edge of the frame body 80 on the front surface of the bottom plate 90.

The main body portion 61 of the second FPC60 of the movable portion is arranged between the coil substrate 50 and the sensor substrate 70. The sensor substrate 70 is fixed to the main body portion 61 of the second FPC60 from the rear side. The coil substrate 50 is fixed to the main body portion 61 of the second FPC60 from the front side. The coil substrate 50 and the sensor substrate 70 are both electrically connected at the rear side of the second FPC60.

The image sensor driving device is accommodated in a space surrounded by the case 10 and the bottom plate 90. Inside the case 10, the front surface of the protruding portion 320 of the holder 30 is fixed to the rear surface of the front wall 100 of the case 10. The holder 30 surrounds the AF motor 110 of the lens driving device from the outside. There is a gap between the through hole 311 of the holder 30 and the AF motor 110. This is used to adjust the position and posture of the AF motor 110 in the assembly work. The image sensor 2 on the sensor substrate 70 is exposed to the front surface through the through hole 611 of the main body portion 61 of the second FPC60 and the through hole 511 of the coil substrate 50.

Figure 9:
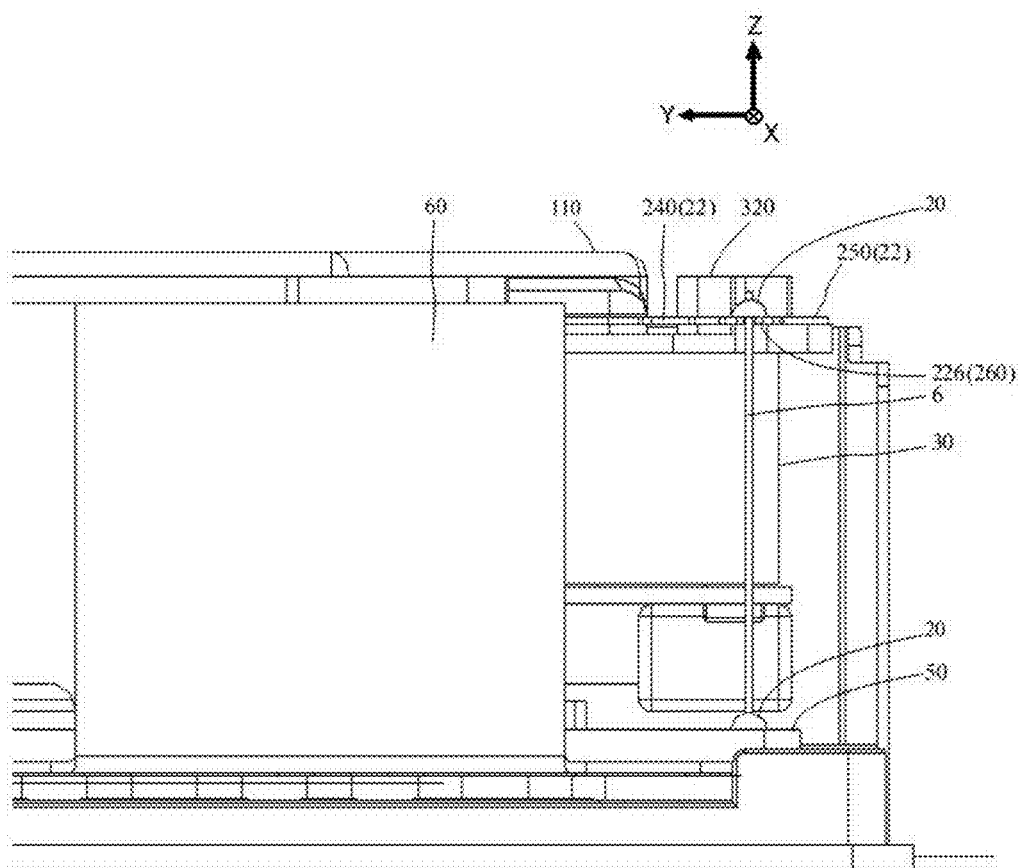
FIG. 9 is a view showing a coupling portion of a supporting plate spring and a suspension wire, and a coupling portion of the suspension wire and a coil substrate of the actuator of FIG. 3.

As shown in FIG. 9, the front end of the suspension wire 6 is inserted into the notch 226 of the supporting plate spring 22, the rear end thereof is inserted into the round hole 506 of the coil substrate 50, and the inserted front side portions are fixed by solders 20. The supporting plate spring 22 is fixed to the front portion of the holder 30 by the large rectangular sheet portion 220 and the small rectangular sheet portion 230, but the first spring portion 240 and the second spring portion 250 including the supporting portion 260 are in a state of protruding outward from the holder 30 and floating. Thus, when an impact occurs, the first spring portion 240 and the second spring portion 250 are elastically deformed, and the impact transmitted to the suspension wire 6 can be suppressed. In order to realize this structure, as shown in FIG. 9, the protruding portion 320 of the holder 30 is higher than the amount by which the front end portion of the suspension wire 6 protrudes from the supporting portion 260 with a margin. There are gaps between the four corner portion of the side wall 102 of the case 10 and the chamfered portions of the four corners of the holder 30. The suspension wires 6 are arranged in the gaps at the four corners, and extend between the supporting plate springs 22 and the coil substrate 50 through the gaps at the four corners.

As shown in FIG. 2, the top portion 121 and the long plate portion 122 of the first FPC12 are exposed to the front side and the left side of the case 10. The tip portion 66 of the coupling portion 62 of the second FPC60 passes through the slot 804 of the frame body 80 and the notch 904 of the bottom plate 90 and protrudes to the upper side and the lower side of the case 10. The terminals 120 of the first FPC12 and the terminals 620 of the second FPC60 are electrically connected to the substrate of the external smartphone 5.

Figure 10:
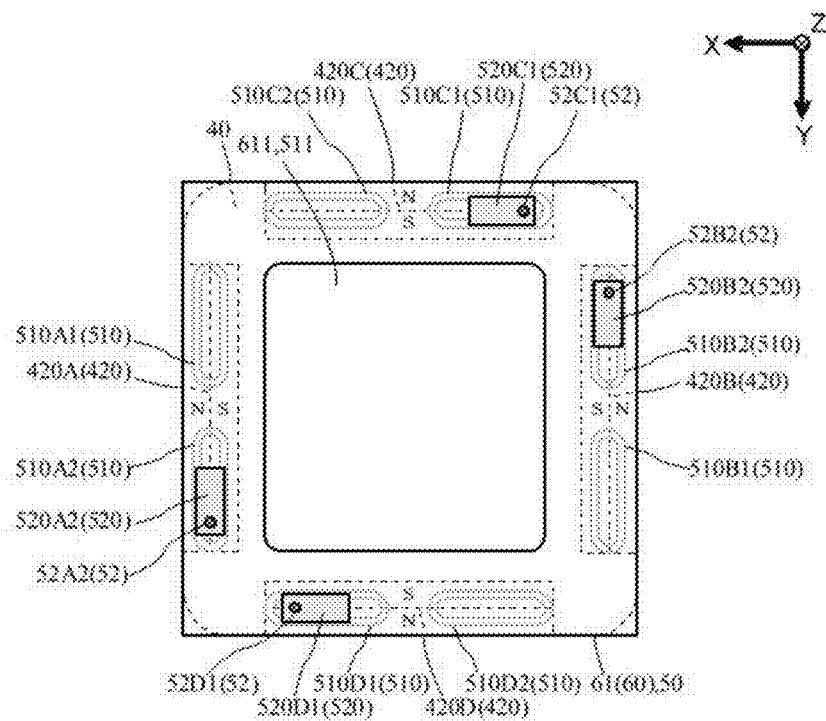
FIG. 10 is a view of a main body portion of the second FPC60, the coil substrate and a partition plate of FIG. 3 and FIG. 4, as viewed from the −Z direction.

As shown in FIG. 10, each magnet 420, each coil 510, each position sensor 52 and each driver IC 520 are distinguished and arranged as follows. The magnet 420A is arranged on the +X (left) side, the magnet 420B is arranged on the −X (right) side, the magnet 420C is arranged on the −Y (lower) side, and the magnet 420D is arranged on the +Y (upper) side. The coil 510A1 is arranged on the left lower side. The coil 510A2, the position sensor 52A2 and the driver IC 520A2 are arranged on the left upper side. The coil 510B1 is arranged on the right upper side. The coil 510B2, the position sensor 52B2 and the driver IC 520B2 are arranged on the right lower side. The coil 510C1, the position sensor 52C1 and the driver IC 520C1 are arranged on the lower right side. The coil 510C2 is arranged on the lower left side. The coil 510D1, the position sensor 52D1 and the driver IC 520D1 are arranged on the upper left side. The coil D2 is arranged on the upper right side.

Each magnet 420 is magnetically divided into an inner side and an outer side. The surface on the inner side facing the −Z (rear) side is magnetized as the S pole, and the surface on the inner side facing the −Z (rear) side is magnetized as the N pole. The magnetic poles may be reversed. In a state where no electric current flows through the coils 510, one straight portion of each coil 510 is opposed to the surface facing rearward on the inner side of each magnet, and the other straight portion is opposed to the surface facing rearward on the outer side. In addition, each position sensor 52 is located on the boundary line between the S pole and the N pole of the magnet 420 opposed to each other. This position is referred to as the initial position.

Under the control of the driver IC 520, when a predetermined electric current is supplied to the coils 510, an electromagnetic force in the X direction is generated in the coils 510A1, 510A2, 510B1 and 510B2 by the magnetic action between the coils 510 and the magnets 420. An electromagnetic force in the Y direction is generated in the coils 510C1, 510C2, 510D1 and 510D2. Thereby, the movable body moves and rotates relative to the fixed body against the elastic force of the suspension wires 6. For example, when a clockwise electric current flows through the coils 510A1 and 510A2 and a counter clockwise electric current flows through the coils 510B1 and 510B2, the movable body moves in the −X direction, and when a reverse electric current flows, respectively, the movable body moves in the +X direction. When a clockwise electric current flows through the coils 510C1 and 510C2 and a counter clockwise electric current flows through the coils 510D1 and 510D2, the movable body moves in the +Y direction, and when a reverse electric current flows, respectively, the movable body moves in the −Y direction. The movable body rotates in the clockwise direction when a clockwise electric current flows through the coils 510A1, 510B1, 510C1 and 510D1 and a counter clockwise electric current flows through the coils 510A2, 510B2, 510C2 and 510D2, and the movable body rotates in the counter clockwise direction when a reverse electric current flows.

In FIG. 10, four position sensors 52A2, 52B2, 52C1 and 52D1 are arranged in two pairs of two. One pair of position sensors 52A2 and 52B2 detects the displacement of the movable portion in the X direction, and the other pair of position sensors 52C2 and 52D2 detects the displacement of the movable portion in the Y direction.

When two coils 510 arranged at positions right opposite each other corresponding to the opposing two sides are set as one set of coils, one position sensor 52 is provided for each set of coils 510. The position sensor 52 is arranged at a position corresponding to one coil 510 in each set of coils 510. That is, the position sensor 52A2 is provided corresponding to a set of coils in which two coils 510A2 and coil 510B1 are set as one set of coils. Accordingly, the position sensor 52A2 is arranged at a position corresponding to the coil 510A2 in this set of coils. The same applies to the other position sensors 52B2, 52C1 and 52D1. The position sensors 52 are all provided at positions away from the connecting portions 65 and the position sensors 52 are not arranged in the vicinity of the connecting portions 65.

The driver IC 520 receives the output signals of the position sensors 52, and determines the position of the movable portion based on positive/negative and the amplitude of the output signals. Based on the result, the driver IC 520 causes a predetermined electric current to flow through the coil 510.

Figure 11:
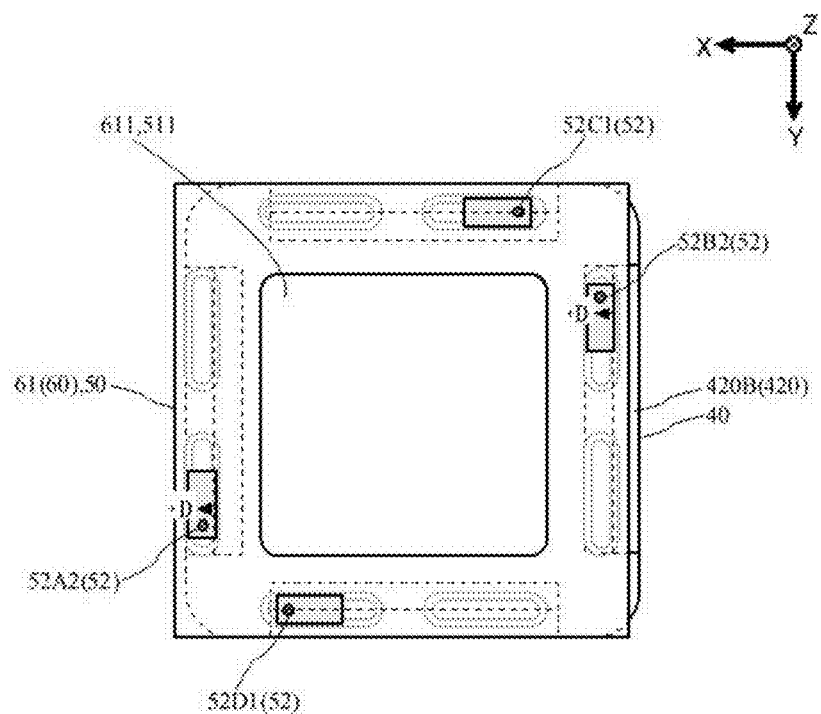
FIG. 11 is a view of the main body portion of the second FPC60, the coil substrate and the partition plate when the image sensor of FIG. 10 is operated to move on the +X side as viewed from the −Z side.

Next, an output of the position sensor in the case where the movable portion moves or rotates will be described. As shown in FIG. 11, when the movable portion moves from the initial position to a position separated by D in the +X (left) direction, signals +D corresponding to the displacement amount +D to the +X side are output from the position sensors 52A2 and 52B2, and the signal outputs from the position sensors 52C1 and 52D1 are 0.

Figure 12:
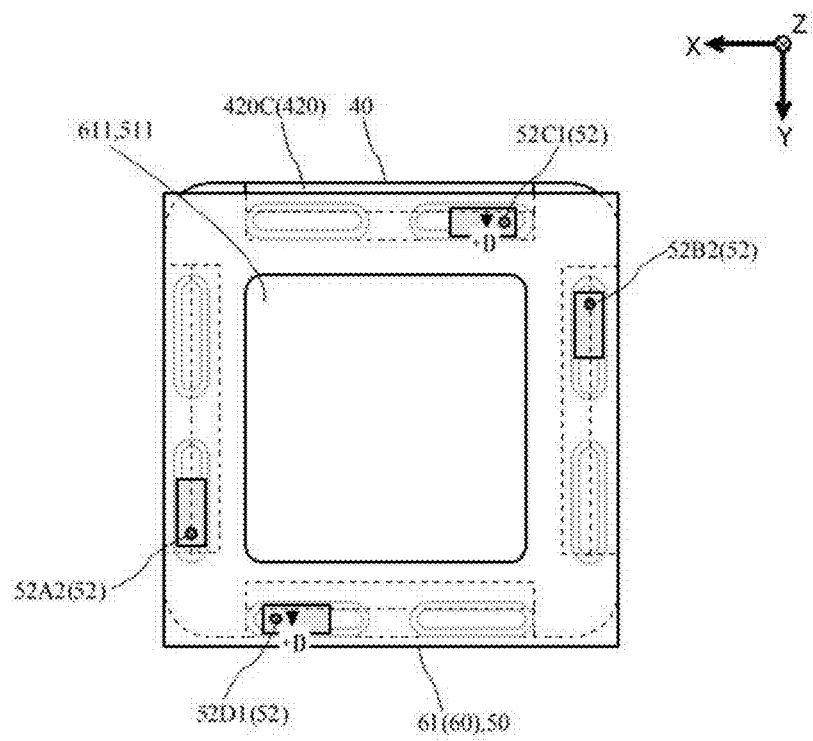
FIG. 12 is a view of the main body portion of the second FPC60, the coil substrate, and the partition plate when the image sensor of FIG. 10 is operated to move on the +Y side as viewed from the −Z side.

In addition, as shown in FIG. 12, when the movable portion moves from the initial position to a position separated by D in the +Y (upper) direction, signals +D corresponding to the displacement amount +D to the +Y side are output from the position sensors 52C1 and 52D1, and the signal outputs from the position sensors 52A2 and 52B2 are 0.

Figure 13:
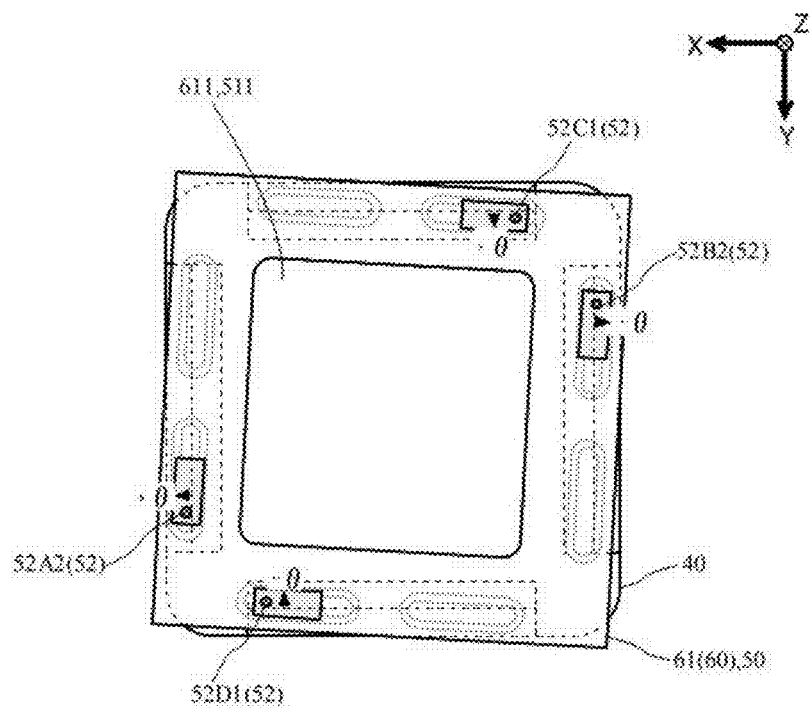
FIG. 13 is a view of the main body portion of the second FPC60, the coil substrate, and the partition plate when the image sensor of FIG. 10 is rotated in the clockwise direction, as viewed from the −Z side.

Furthermore, as shown in FIG. 13, when the movable portion is rotated by θ in the clockwise direction from the initial position, a signal +θ corresponding to the displacement in the +X direction is output from the position sensor 52A2, and a signal −θ corresponding to the displacement in the −X direction is output from the position sensor 52B2. Further, a signal +θ corresponding to the displacement in the +Y direction is output from the position sensor 52C1, and a signal −θ corresponding to the displacement in the −Y direction is output from the position sensor 52D1. A rotation is determined when the outputs of the position sensor 52A2 and the position sensor 52B2 are added to each other to be 0 and the outputs of the position sensor 52C1 and the position sensor 52D1 are added to each other to be 0.

It is assumed that the position sensor 52B2 is used as the position sensor 52B1 and is opposed to the position sensor 52A2 at a position right opposite the position sensor 52A2. In addition, it is also assumed that the position sensor 52D1 is used as the position sensor 52D2 and is opposed to the position sensor 52C1 at a position right opposite the position sensor 52C1. In this case, the outputs of the position sensor 52A2 and the position sensor 52B1 are both +θ, and it is determined to be the displacement in the +X direction. Similarly, the outputs of the position sensor 52C1 and the position sensor D2 are both +θ, and it is determined to be the displacement in the +Y direction. Therefore, the rotation cannot be determined.

That is, the two position sensors 52 arranged corresponding to the opposing two sides are arranged such that one is displaced to the +side and the other is displaced to the −side when they are rotated. In the case of the structure where the image sensor 2 is not rotated, it is not limited to this.

When the movable portion moves in combination of the displacement and rotation in the X direction and the Y direction, a signal obtained by adding the above is output from the position sensor 52.

The above descriptions are the details of the present embodiment. According to the present embodiment, the following effects are obtained.

In the present embodiment, the actuator 3 includes: a sensor substrate 70 having an image sensor 2 on a front surface thereof; a coil substrate 50 that has a coil 510 for driving the image sensor 2 and is provided with a first through hole 511; and an second FPC 60 having a main body portion 61 and a coupling portion 62 extending from a periphery of the main body portion 61 and coupled to an outside, wherein the main body portion 61 is provided with a second through hole 611. In addition, the sensor substrate 70 is fixed to the main body portion 61 from a rear side, the coil substrate 50 is fixed to the main body portion 61 from a front side, and the image sensor 2 is exposed to a front surface through the first through hole 511 and the second through hole 611. Since the sensor substrate 70 is fixed to surface on the rear side of the second FPC60 and the coil substrate 50 is fixed to the surface on the front side of the second FPC60, they can thus be directly electrically connected to the second FPC60, respectively. Therefore, it is possible to provide the actuator 3, the camera module 4 and the camera mounting device that can enhance the efficiency in the power supply wiring of the device having the mechanism for correcting the camera shake by moving the image sensor 2.

Furthermore, in the present embodiment, actuator 3 includes: a lens driving device having a driving mechanism for driving the lens body 1 forward and backward in the optical axis direction and fixed to a case 10; a movable portion arranged on the rear side of the lens driving device together with an image sensor 2; a holder 30 fixed to the case 10 and surrounding the lens driving device from the outside; a supporting plate spring 22 fixed to the front surface of the holder 30; and a plurality of suspension wires 6 coupling the supporting plate spring 22 and the movable portion. As a result, the impact received by the supporting plate spring 22 is alleviated, so that the suspension wires 6 are less likely to be damaged. Therefore, it is possible to provide the actuator 3, the camera module 4 and the camera mounting device, in which the suspension wires 6 supporting the movable portion are less likely to be damaged.

Furthermore, in the present embodiment, the actuator 3 includes a fixed portion and a movable portion having a rectangular image sensor 2, coils 510 and position sensors 52. The coils 510 are arranged at positions corresponding to the respective sides of the image sensor 2, and two coils 510 are juxtaposed along each of opposing two sides, respectively. When two coils 510 arranged at positions right opposite each other corresponding to the opposing two sides are set as one set of coils, one position sensor 52 is provided for each set of coils. The position sensor 52 is arranged at a position corresponding to one coil 510 in each set of coils. Thus, the position sensor 52 can detect the position and the rotation amount of the image sensor 2 in the in-plane direction thereof. As a result, displacement between the position of the movable portion and the target position can be determined based on the output signal of the position sensor 52, and the movable portion can be moved to the target position including rotation while correcting the displacement of the position. Therefore, it is possible to provide the actuator 3, the camera module 4 and the camera mounting device, which can control the movement of the movable portion in three-axis directions with high accuracy.

Moreover, in the present embodiment, the actuator 3 includes: a case 10 having a through hole 101 at the center; a lens driving device that has a lens driving mechanism for driving the lens body 1 forward and backward in the optical axis direction and a first FPC12, and is exposed from the through hole 101 and fixed to the case 10; and an image sensor driving device that has an image sensor driving mechanism for driving the image sensor 2 in the X direction and the Y direction, which are different directions from the optical axis direction, and is arranged on the rear side of the lens driving device. In addition, the first FPC12 has a long plate portion 122 extending along the outer side surface of the case 10 and a short plate portion 123 entering the inside of the case 10 through the through hole 101, and the short plate portion 123 is electrically connected to the lens driving device. Thus, in the assembly work of the actuator 3, the wiring work of the first FPC12 to the lens driving mechanism and the wiring work to the image sensor driving mechanism can be independently performed. This makes it possible to provide the actuator 3, the camera module 4, and the camera mounting device with high assembly efficiency.

Figure 14:
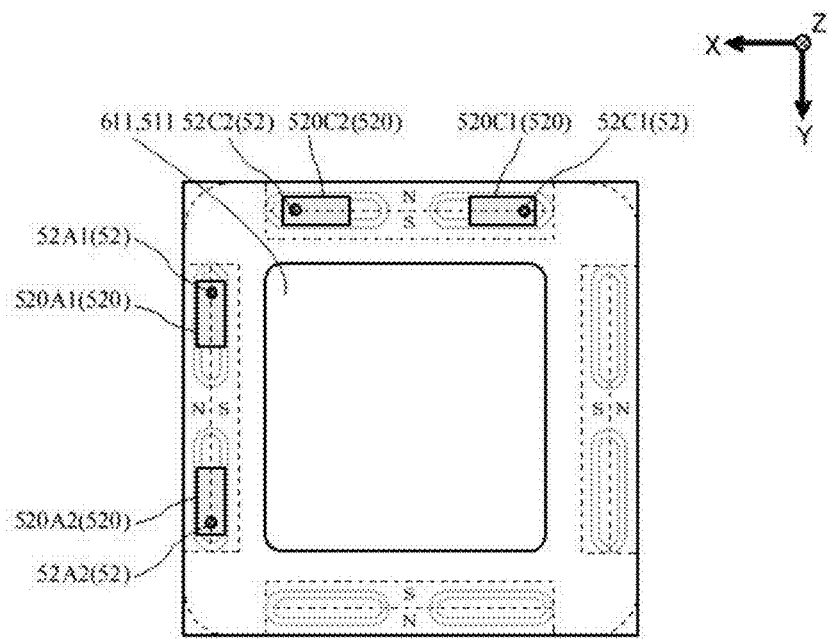
FIG. 14 is a view showing another example of the arrangement of the position sensors of the main body portion of FIG. 10.

In the above embodiment, the position sensors 52 of the opposing two sides are arranged at positions obliquely opposite to each other, such as the position sensor 52A2 and the position sensor 52B2, and the position sensor 52C1 and the position sensor 52D1. However, it is to be note that, as shown in FIG. 14, the position sensor 52A1 and the position sensor 52A2 may be arranged in a line along one side, and the position sensor 52C1 and the position sensor 52C2 may be arranged in a line along one side. In addition, the two position sensors 52 of one pair of opposing two sides may be arranged at positions obliquely opposite each other, and the two position sensors 52 of the other pair of opposing sides may be arranged in a line along one side.

Furthermore, four wire protecting portions for protecting the suspension wires 6 may be provided on the chamfered portions at the four corners of the holder 30. Each of the four wire protecting portions has a curved surface portion in a half-split tube shape. The suspension wires 6 extend between the supporting plate springs 22 and coil substrate 50 of the movable portion through the curved surface portions of the four wire protecting portions. In addition, a resin having viscoelasticity such as a damper gel may be bridged between the holder 30 and the suspension wire 6.

Furthermore, the coils 510 may be arranged at positions corresponding to the respective sides of the image sensor 2, and may be arranged as follows, for example: On one pair of opposing two sides, i.e., the left side and the right side, two coils 510A1 and 510A2 and two coils 510B1 and coil 510B2 are arranged in a line along the sides, respectively. In addition, on the other pair of opposing two sides, i.e., the lower side and the upper side, one coil 510C and one coil 510D are arranged, respectively. At this time, the two coils 510A2 and 510B1 and the coils 510A1 and coil 510B2 arranged at positions right opposite each other corresponding to the opposing two sides are set as one set of coils, respectively. One position sensor 52A1 and one position sensor 52B2 are provided corresponding to each set of coils, respectively. The position sensors 52A2 and 52B2 are arranged at positions corresponding to one of the coils 510A2 and coils 510B2 in each set of coils. Furthermore, two coils 510C and 510D arranged at positions right opposite each other corresponding to the opposing two sides are set as one set of coils. For example, a position sensor 52C is provided corresponding to this set of coils. The position sensor 52C is arranged at a position corresponding to the coil 510C in the set of coils.

When the movable portion is moved in the X direction, a predetermined electric current is supplied through the coils 510A1, 510A2, 510B1 and 510B2 in the same manner as described above. When the movable portion is moved in the Y direction, a predetermined electric current is supplied through the coils 510C and 510D. When the movable portion is rotated in the θ direction, the same electric current as described above is supplied through only the coils 510A1, 510A2, 510B1 and 510B2 and no electric current is supplied through the coils 510C and 510D.

At this time, the position sensor 52A2 and the position sensor 52B2 can detect the displacement amount in the X direction. Furthermore, the rotation in the θ direction can be detected. Moreover, the position sensor 52C can detect the displacement amount in the Y direction.

What is claimed is:

1. An actuator, comprising:

a sensor substrate with an image sensor with light incident thereon from a front side, the image sensor being provided on a front surface of the front side of the sensor substrate;

a coil substrate comprising a coil for driving the image sensor, the coil substrate being provided with a first through hole; and a flexible printed circuit board (FPC) comprising a main body portion including a driver integrated circuits (IC) having a position sensor built therein and a coupling portion extending from a periphery of the main body portion and coupled to outside, the main body portion being provided with a second through hole and a front side, wherein the sensor substrate and the driver IC are is-fixed to a same surface of a rear side opposite to the front side of the main body portion from the rear side of the main body portion, the coil substrate is fixed to a surface of the front side of the main body portion from the front side of the main body portion, and the image sensor is exposed to the front side of the main body portion through the first through hole and the second through hole;

the driver IC is provided at a position opposing to the coil, and the sensor substrate has a notch corresponding to the position of the driver IC, wherein the position sensor is exposed to the front side of the main body and the rear side.

2. The actuator according to claim 1, wherein the position sensor is provided at a position opposing to the coil on the main body portion on the same side as the sensor substrate.

3. The actuator according to claim 2, wherein the position sensor is exposed to the rear side through the notch.

4. The actuator according to claim 1, wherein the coil substrate is electrically connected to the FPC from a rear side of the FPC.

5. A camera module comprising the actuator according to claim 1.

6. A camera mounting device comprising the camera module according to claim 5.

* * * * *